(12) United States Patent
Godfrey et al.

(10) Patent No.: US 10,120,422 B2
(45) Date of Patent: Nov. 6, 2018

(54) VERTICAL MODULAR COMPUTING DEVICE

(71) Applicant: Lenovo (Singapore) Pte. Ltd., Singapore (SG)

(72) Inventors: Cyan Godfrey, Chapel Hill, NC (US); Cuong Huy Truong, Cary, NC (US); Ali Kathryn Ent, Raleigh, NC (US); Thomas Perelli, Raleigh, NC (US)

(73) Assignee: Lenovo (Singapore) Pte. Ltd., Singapore (SG)

( * ) Notice: Subject to any disclaimer, the term of this patent is extended or adjusted under 35 U.S.C. 154(b) by 38 days.

(21) Appl. No.: 15/019,749

(22) Filed: Feb. 9, 2016

(65) Prior Publication Data

US 2017/0227997 A1    Aug. 10, 2017

(51) Int. Cl.
*G06F 1/18* (2006.01)
*H05K 5/00* (2006.01)

(52) U.S. Cl.
CPC .............. *G06F 1/182* (2013.01); *G06F 1/183* (2013.01); *H05K 5/0021* (2013.01)

(58) Field of Classification Search
CPC ........ G06F 1/182; G06F 1/183; H05K 5/0021
See application file for complete search history.

(56) References Cited

U.S. PATENT DOCUMENTS

| | | | | | |
|---|---|---|---|---|---|
| 4,501,460 A | * | 2/1985 | Sisler | ...................... | G06F 1/181 |
| | | | | | 361/679.58 |
| 5,602,721 A | * | 2/1997 | Slade | ........................ | G06F 1/18 |
| | | | | | 206/504 |
| 5,604,662 A | * | 2/1997 | Anderson | ................ | G06F 1/184 |
| | | | | | 312/204 |
| 5,667,399 A | * | 9/1997 | Jackson | ................... | A63F 13/08 |
| | | | | | 439/341 |
| 5,909,357 A | * | 6/1999 | Orr | ........................... | G06F 1/16 |
| | | | | | 361/679.46 |
| 5,984,732 A | * | 11/1999 | Mehring | .............. | H05K 5/0021 |
| | | | | | 439/701 |
| 6,661,648 B2 | * | 12/2003 | Dayley | ................... | G06F 1/181 |
| | | | | | 361/679.22 |

(Continued)

*Primary Examiner* — Hoa C Nguyen
*Assistant Examiner* — Keith Depew
(74) *Attorney, Agent, or Firm* — Ference & Associates LLC

(57) ABSTRACT

One embodiment provides a system, including: a base module housing comprising a top, a bottom, and at least one lateral edge comprising a top side and a bottom side, the base module housing comprising: a processor; a memory device operatively coupled to the processor; and at least one connector, disposed at the top side of the base module housing, for facilitating electrical connections; and a cap module housing comprising a top, a bottom, at least one lateral edge comprising a top side and a bottom side, the cap module housing comprising: at least one receiver, disposed at the bottom side of the cap module housing, for receiving at least one connector; wherein the base module housing and cap module housing are vertically connectable using at least one latch mechanism; wherein at least a portion of the at least one latch mechanism is disposed at the top side of the base module housing; and wherein at least a portion of the at least one latch mechanism is disposed at the bottom side of the cap module housing. Other aspects are described and claimed.

21 Claims, 4 Drawing Sheets

(56) References Cited

U.S. PATENT DOCUMENTS

| | | | | |
|---|---|---|---|---|
| 6,678,747 B2* | 1/2004 | Goossen | ............. | G06F 13/4095 |
| | | | | 361/726 |
| 7,170,557 B2* | 1/2007 | Manico | ................. | G06F 1/1601 |
| | | | | 348/333.06 |
| 7,239,509 B1* | 7/2007 | Roeske | ................. | G06F 1/1632 |
| | | | | 361/679.02 |
| 7,307,834 B2* | 12/2007 | Jones | ................... | H05K 5/0021 |
| | | | | 361/679.55 |
| 8,169,777 B2* | 5/2012 | Huang | .................... | G06F 1/181 |
| | | | | 248/223.31 |
| 2008/0002346 A1* | 1/2008 | Lin | ........................ | G06F 1/181 |
| | | | | 361/735 |

* cited by examiner

VERTICAL MODULAR COMPUTING DEVICE

BACKGROUND

Users use information handling devices (e.g., tablets, personal computers, laptop computers, smart watches, etc.) as methods for performing many tasks, for example, playing games, generating documents, accessing online services, and the like. Many companies employ the use of personal computers (e.g., desktop computers, tower computers, workstation computers, and the like) for employees due to the fact that these types of computers generally provide more processing power, speed, and digital storage space.

However, the bulky nature of existing personal computers have caused some employers to turn to smaller, portable information handling devices (e.g., tablets, laptop computers, etc.). However, unlike the personal computer, the smaller, portable information handling devices do not allow a user to easily expand the capabilities of the device. The large size and expansion slots of the personal computer allow users to expand the functions and features of the personal computer. For example, a user needing a more powerful graphics card can replace the graphics card in a personal computer, which is not easily accomplished with a smaller, portable information handling device. As another example, if a user needs more storage space, a user can add another hard disk drive or replace the current hard disk drive with a larger hard disk drive. Replacing a hard disk drive on a smaller, portable information handling device is not only very time consuming and difficult, but also, in some cases, impossible.

BRIEF SUMMARY

In summary, one aspect provides a system, comprising: a base module housing comprising a top, a bottom, and at least one lateral edge comprising a top side and a bottom side, the base module housing comprising: a processor; a memory device operatively coupled to the processor; and at least one connector, disposed at the top side of the base module housing, for facilitating electrical connections; and a cap module housing comprising a top, a bottom, at least one lateral edge comprising a top side and a bottom side, the cap module housing comprising: at least one receiver, disposed at the bottom side of the cap module housing, for receiving at least one connector; wherein the base module housing and cap module housing are vertically connectable using at least one latch mechanism; wherein at least a portion of the at least one latch mechanism is disposed at the top side of the base module housing; and wherein at least a portion of the at least one latch mechanism is disposed at the bottom side of the cap module housing.

Another aspect provides a device, comprising: a module housing comprising a top, a bottom, and at least one lateral edge comprising a top side and a bottom side; at least one connector, disposed at the top side the module housing, for facilitating electrical connections; and at least another connector, disposed at the bottom side of the module housing, for facilitating electrical connections; wherein the module housing is connectable to another module housing using at least one latch mechanism; wherein at least a portion of the latch mechanism is disposed at the bottom side of the module housing; and wherein at least another portion of the latch mechanism is disposed at the top side of the module housing.

A further aspect provides a device, comprising: a module housing comprising a top, a bottom, and at least one lateral edge comprising a top side and a bottom side; and at least one connector, disposed at the top side of the module housing, for facilitating electrical connections; wherein the module housing is connectable to another module housing using at least one latch mechanism; and wherein at least a portion of the latch mechanism is disposed at the top side of the module housing.

The foregoing is a summary and thus may contain simplifications, generalizations, and omissions of detail; consequently, those skilled in the art will appreciate that the summary is illustrative only and is not intended to be in any way limiting.

For a better understanding of the embodiments, together with other and further features and advantages thereof, reference is made to the following description, taken in conjunction with the accompanying drawings. The scope of the invention will be pointed out in the appended claims.

DETAILED DESCRIPTION

Figure 1:
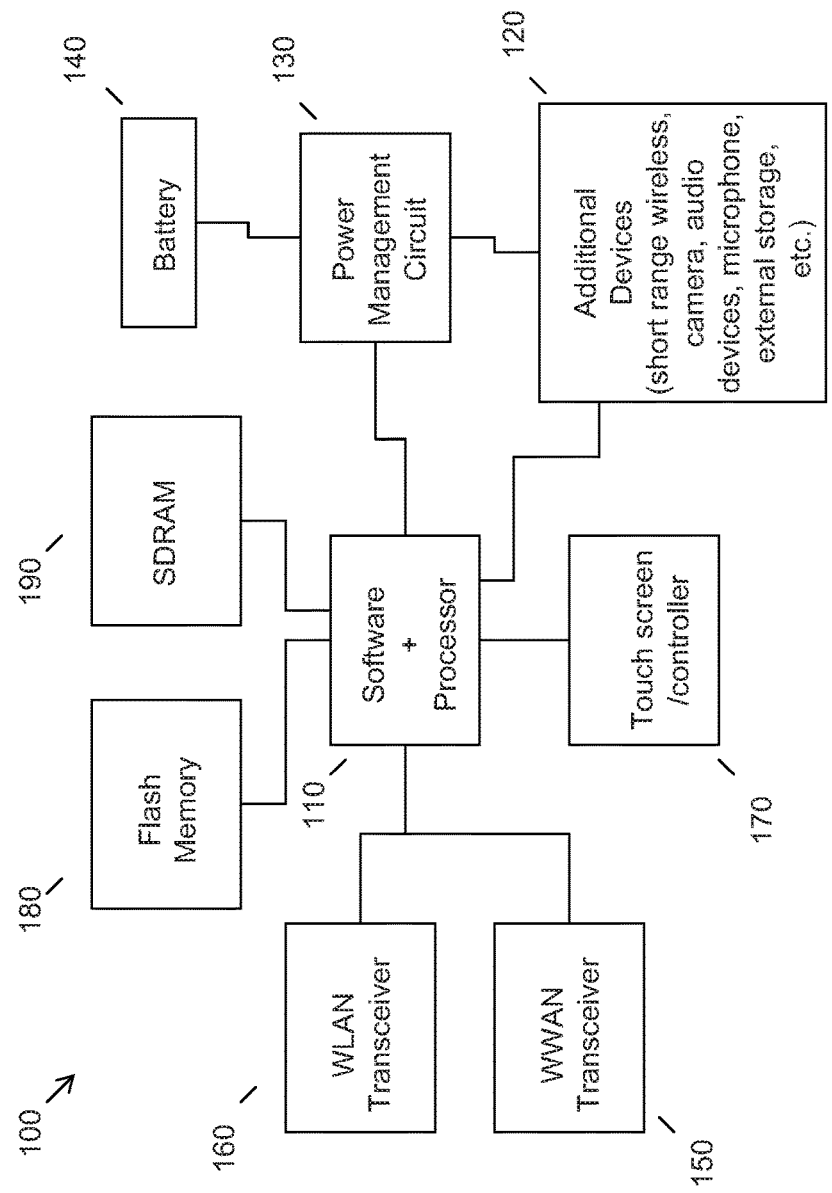
FIG. 1 illustrates an example of information handling device circuitry.

It will be readily understood that the components of the embodiments, as generally described and illustrated in the figures herein, may be arranged and designed in a wide variety of different configurations in addition to the described example embodiments. Thus, the following more detailed description of the example embodiments, as represented in the figures, is not intended to limit the scope of the embodiments, as claimed, but is merely representative of example embodiments.

Reference throughout this specification to "one embodiment" or "an embodiment" (or the like) means that a particular feature, structure, or characteristic described in connection with the embodiment is included in at least one embodiment. Thus, the appearance of the phrases "in one embodiment" or "in an embodiment" or the like in various places throughout this specification are not necessarily all referring to the same embodiment.

Furthermore, the described features, structures, or characteristics may be combined in any suitable manner in one or more embodiments. In the following description, numerous specific details are provided to give a thorough understanding of embodiments. One skilled in the relevant art will recognize, however, that the various embodiments can be practiced without one or more of the specific details, or with other methods, components, materials, et cetera. In other instances, well known structures, materials, or operations are not shown or described in detail to avoid obfuscation.

Existing personal computers chassis sizes are fixed, meaning the computer will take up the same amount of space even if the user does not need or use all the space afforded by the chassis. The computers are often large and have a significant amount of empty space inside the computer tower. Computer manufacturers provide the extra space to allow for many different configurations. For example, some users may want or need multiple removable media drives (e.g., digital video disc (DVD) drives, compact disc (CD) drives, 3.5" disc drives, etc.). Other users may need multiple hard disc drives. As such, the computers are manufactured in a way that allows the end user to configure and expand the computer as needed or desired by the user. However, for the users that do not need additional components the extra space within the chassis is wasted and also results in a computer workstation having a larger unnecessary footprint. Due to the larger footprint computers are typically placed on the floor or in a corner on a desk. This causes the connection ports, usually located on the back of the computer tower, to be difficult to access. Due to the distance between the tower and peripherals, the cabling can become messy.

Smaller personal computers and portable information handling devices (e.g., tablets, smart phones, laptop computers, etc.) have a smaller footprint. However, these devices do not allow an end-user as many options regarding the configuration of the device. For example, a user may not be able to add additional storage space. Also, some components cannot be changed at all and the device has to be purchased with the desired component. For example, the graphics card within a laptop cannot be changed with a more powerful graphics card. Additionally, because the device components cannot be changed, the device cannot be upgraded or updated as components become obsolete. Since the components cannot be easily swapped, once the device is purchased, the user is essentially stuck with the configuration as purchased. Additionally, while the connection ports are easier to access, these smaller devices generally do not have as many connection ports as the larger counterpart. The reduction in connection ports results in a user not having as many options or spaces for connecting peripheral devices.

These technical issues present problems for users when purchasing personal computers or other information handling devices. A user who wants the ability to configure and change the computer has to purchase a large personal computer, which has a large footprint, even if the user does not need all the empty space within the personal computer chassis. Additionally, due in part to the large footprint, the personal computer is usually placed in a location which causes the connection ports to become less accessible. Thus, the user has to contend with a large bulky computer in order to ensure the ability to configure and upgrade the computer as desired.

Accordingly, an embodiment provides a modular computing device that allows a user to configure the computer as desired. An embodiment comprises of a base computing device module having a processor and memory. In one embodiment, the base module may include components typically found in a standard computer workstation. For example, the base module may include a motherboard, processor, memory, hard drive, and other components normally included in a personal computer. The base module may also include a connector for facilitating electrical connections. For example, in one embodiment the base module includes an electrical connector (e.g., universal serial bus (USB) connector, serial port connector, blade connector, peripheral component interconnect (PCI) connector, etc.) located on the top side of the module.

An embodiment may also include a cap module. When coupled to the top of a second module (e.g., the base module, another module, etc.), the cap module may act as a lid for the modular computing device. The cap module may also include a receiver for the connector of the second module. For example, when attached to the base module, the cap module may include a recess to accept the connector of the base module. In one embodiment, the cap module may include feet located on the bottom side of the module. For example, the cap module may have some protrusions on the bottom. When the cap module is removed from the module computing device, the protrusions may act as feet to help protect components, connectors, and the like, located on the bottom of the module from being scratched, bent, becoming dirty, and the like. When the cap module is being placed on top of the modular computing device, these protrusions may act as an alignment mechanism. For example, the base module may include recesses located on the top of the module. The protrusions on the cap module may be paired with these recesses to ensure alignment of the cap and base module, which may ensure alignment of any connectors or connections made between the cap and second module. An embodiment may include additional modules that can be stacked within the vertical modular computing device. Example additional modules include a graphics module, storage module, battery module, peripheral device module, display device module, and the like.

Each of the modules may lock into a module below using a latch mechanism. In one embodiment, a portion of the latch mechanism may be included on one module and the other portion of the latch mechanism may be included on a second module. For example, the base module may include a portion of the latch mechanism located at the top of the module. The cap module may include a portion of the latch mechanism located at the bottom of the module. Additional modules may include a portion of one latch mechanism located at the top of the module and a portion of a second latch mechanism located at the bottom of the module. The latch mechanism may work to couple the modules together to act as a unitary piece. For example, a user could pick the coupled modules up using handles included on the cap module and all of the modules would remain coupled together as the user is moving the system using the handles. Thus, the system and devices, as described in more detail below, allow a user the ability to configure a computer as much or as little as possible without needing a large footprint to accommodate the computer. Additionally, the systems and devices allow a user to configure the computer as needed. For example, if the user wants one configuration one day and another the next day, the user can easily remove or add modules as desired.

The illustrated example embodiments will be best understood by reference to the figures. The following description is intended only by way of example, and simply illustrates certain example embodiments.

While various other circuits, circuitry or components may be utilized in information handling devices, with regard to smart phone and/or tablet circuitry 100, an example illustrated in FIG. 1 includes a system on a chip design found for example in tablet or other mobile computing platforms. Software and processor(s) are combined in a single chip 110. Processors comprise internal arithmetic units, registers, cache memory, busses, I/O ports, etc., as is well known in the art. Internal busses and the like depend on different vendors, but essentially all the peripheral devices (120) may attach to a single chip 110. The circuitry 100 combines the processor, memory control, and I/O controller hub all into a single chip 110. Also, systems 100 of this type do not typically use SATA or PCI or LPC. Common interfaces, for example, include SDIO and I2C.

There are power management chip(s) 130, e.g., a battery management unit, BMU, which manage power as supplied, for example, via a rechargeable battery 140, which may be recharged by a connection to a power source (not shown). In at least one design, a single chip, such as 110, is used to supply BIOS like functionality and DRAM memory.

System 100 typically includes one or more of a WWAN transceiver 150 and a WLAN transceiver 160 for connecting to various networks, such as telecommunications networks and wireless Internet devices, e.g., access points. Additionally, devices 120 are commonly included, e.g., an image sensor such as a camera. System 100 often includes a touch screen 170 for data input and display/rendering. System 100 also typically includes various memory devices, for example flash memory 180 and SDRAM 190.

Figure 2:
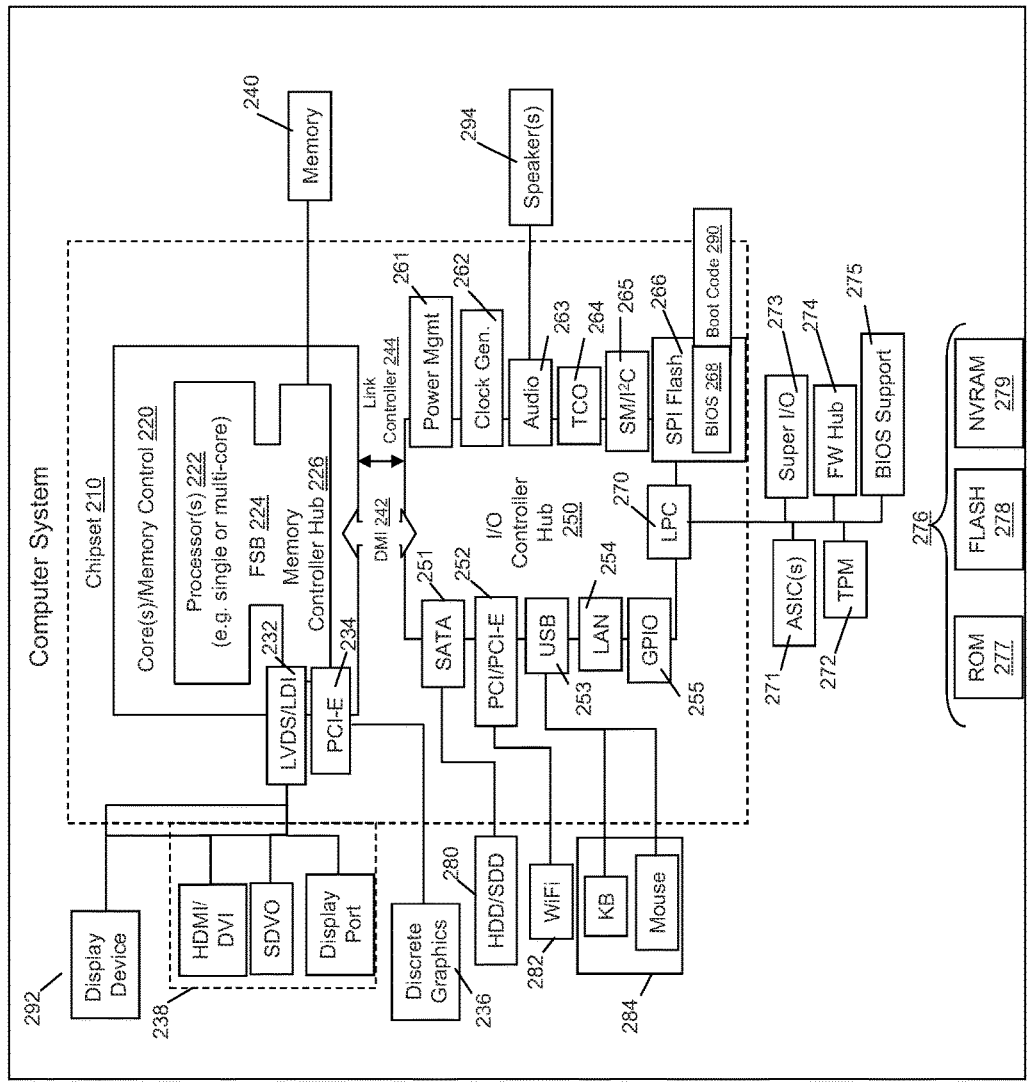
FIG. 2 illustrates another example of information handling device circuitry.

FIG. 2 depicts a block diagram of another example of information handling device circuits, circuitry or components. The example depicted in FIG. 2 may correspond to computing systems such as the THINKPAD series of personal computers sold by Lenovo (US) Inc. of Morrisville, N.C., or other devices. As is apparent from the description herein, embodiments may include other features or only some of the features of the example illustrated in FIG. 2.

The example of FIG. 2 includes a so-called chipset 210 (a group of integrated circuits, or chips, that work together, chipsets) with an architecture that may vary depending on manufacturer (for example, INTEL, AMD, ARM, etc.). INTEL is a registered trademark of Intel Corporation in the United States and other countries. AMD is a registered trademark of Advanced Micro Devices, Inc. in the United States and other countries. ARM is an unregistered trademark of ARM Holdings plc in the United States and other countries. The architecture of the chipset 210 includes a core and memory control group 220 and an I/O controller hub 250 that exchanges information (for example, data, signals, commands, etc.) via a direct management interface (DMI) 242 or a link controller 244. In FIG. 2, the DMI 242 is a chip-to-chip interface (sometimes referred to as being a link between a "northbridge" and a "southbridge"). The core and memory control group 220 include one or more processors 222 (for example, single or multi-core) and a memory controller hub 226 that exchange information via a front side bus (FSB) 224; noting that components of the group 220 may be integrated in a chip that supplants the conventional "northbridge" style architecture. One or more processors 222 comprise internal arithmetic units, registers, cache memory, busses, I/O ports, etc., as is well known in the art.

In FIG. 2, the memory controller hub 226 interfaces with memory 240 (for example, to provide support for a type of RAM that may be referred to as "system memory" or "memory"). The memory controller hub 226 further includes a low voltage differential signaling (LVDS) interface 232 for a display device 292 (for example, a CRT, a flat panel, touch screen, etc.). A block 238 includes some technologies that may be supported via the LVDS interface 232 (for example, serial digital video, HDMI/DVI, display port). The memory controller hub 226 also includes a PCI-express interface (PCI-E) 234 that may support discrete graphics 236.

In FIG. 2, the I/O hub controller 250 includes a SATA interface 251 (for example, for HDDs, SDDs, etc., 280), a PCI-E interface 252 (for example, for wireless connections 282), a USB interface 253 (for example, for devices 284 such as a digitizer, keyboard, mice, cameras, phones, microphones, storage, other connected devices, etc.), a network interface 254 (for example, LAN), a GPIO interface 255, a LPC interface 270 (for ASICs 271, a TPM 272, a super I/O 273, a firmware hub 274, BIOS support 275 as well as various types of memory 276 such as ROM 277, Flash 278, and NVRAM 279), a power management interface 261, a clock generator interface 262, an audio interface 263 (for example, for speakers 294), a TCO interface 264, a system management bus interface 265, and SPI Flash 266, which can include BIOS 268 and boot code 290. The I/O hub controller 250 may include gigabit Ethernet support.

The system, upon power on, may be configured to execute boot code 290 for the BIOS 268, as stored within the SPI Flash 266, and thereafter processes data under the control of one or more operating systems and application software (for example, stored in system memory 240). An operating system may be stored in any of a variety of locations and accessed, for example, according to instructions of the BIOS 268. As described herein, a device may include fewer or more features than shown in the system of FIG. 2.

Information handling device circuitry, as for example outlined in FIG. 1 or FIG. 2, may be used in devices such as tablets, smart phones, personal computer devices generally, and/or electronic devices and may be included within the systems and devices described herein. For example, the circuitry outlined in FIG. 1 may be implemented in a tablet or smart phone embodiment, whereas the circuitry outlined in FIG. 2 may be implemented in a personal computer embodiment.

Figure 3:
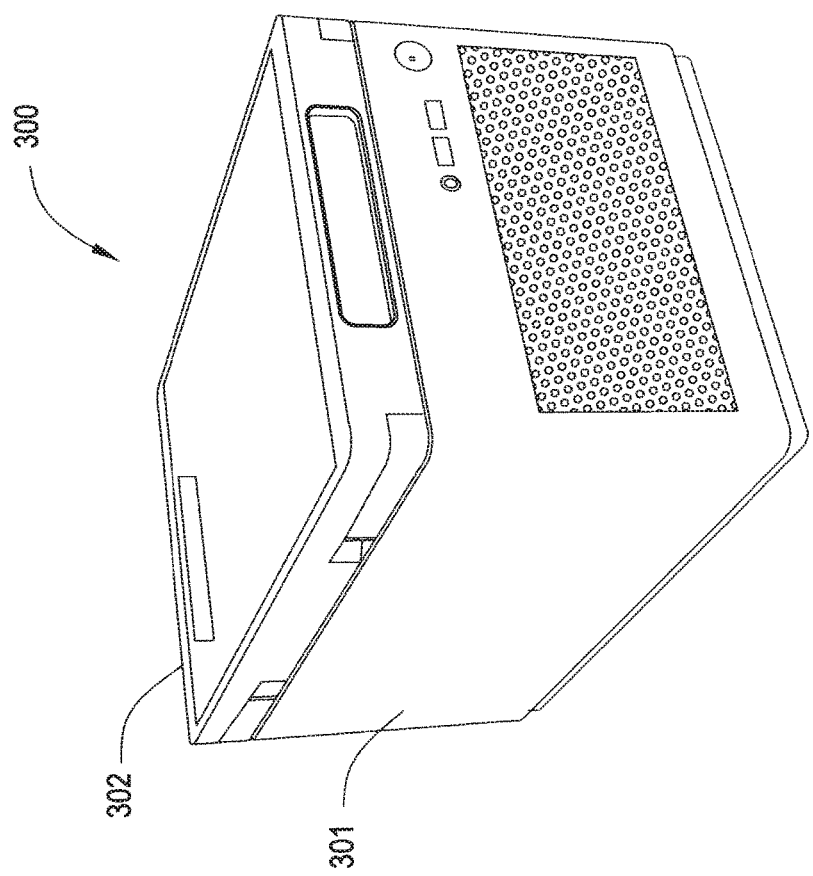
FIG. 3 illustrates an example vertical modular computing device.

FIG. 3 illustrates an example modular computing device 300 having the modules coupled together. The system may include a base module housing 301, having a top, a bottom, and at least one lateral edge forming a top side, a bottom side, and at least one lateral side. For example, as shown in FIG. 3, the modular computing device may be in the form of a rectangular structure. However, the modular computing device may also be formed into other shapes, for example, circular, triangular, square, and the like. The system may also include a cap module housing 302, having a top, a bottom, at least one lateral edge forming a top side, a bottom side, and at least one lateral side. The modules may be made using a variety of materials, for example, aluminum, plastic, another type of metal, a combination of materials, and the like. The modules may also include vents for air circulation.

Figure 4:
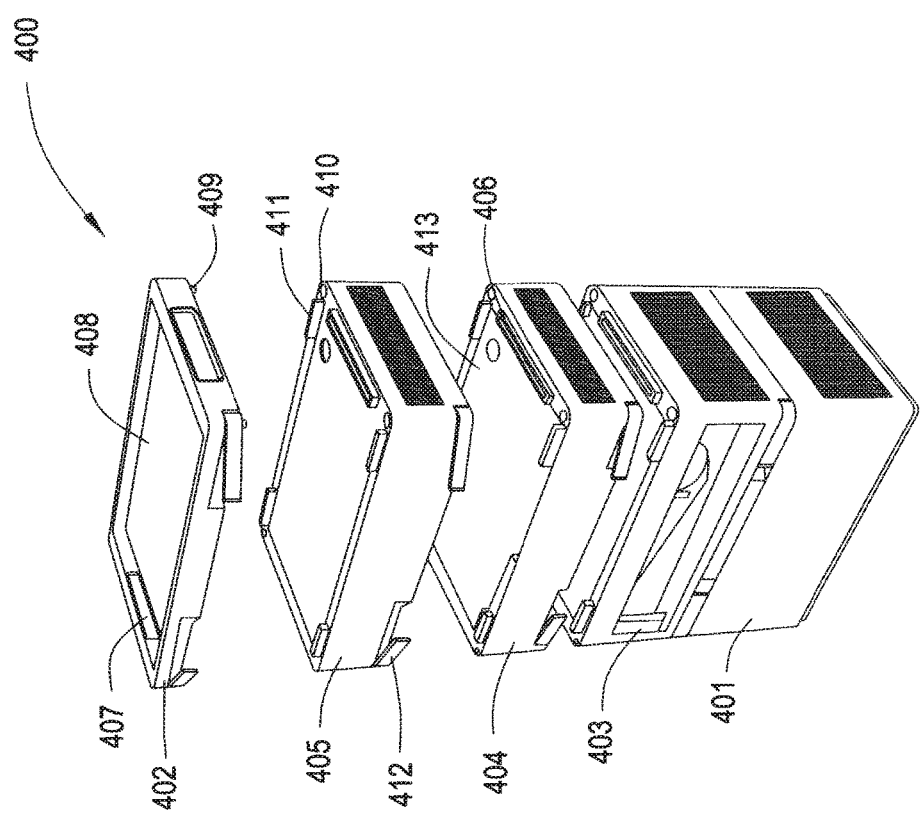
FIG. 4 illustrates an example vertical modular computing device with additional modules.

FIG. 4 illustrates an example module computing device 400 with modules separate from each other. The base module 401 is located at the bottom of the vertical modular stack. The cap module 402 is located at the top of the vertical module stack. The cap module 402 may include at least one indentation for carrying. For example, referring to FIG. 4, the cap module 402 may include openings 407 in the front side and back side of the module for carrying the modular computing device. The indentations or carrying handles may be openings (as shown), but also may only be recesses in the side of the module. The cap module 402 may also include an energy transfer device 408 on the top side of the cap module 402. As an example, the cap module 402 may include a wireless charging mat, which allows a user to place another electronic device on top of the modular computing device for charging. The energy transfer device may also include a device for wirelessly transferring data between another information handling device and the modular computing device.

Each module may include at least one connector 406 for facilitating electrical connections between each of the modules. For example, the connector 406 may be used to facilitate power and/or data transfer between modules. Non-exhaustive example types of connectors include USB connectors, PCI connectors, blade/socket connectors, plug/jack connectors, and the like. The connector 406 may be located at the top side of the module. A single connector is shown in FIG. 4, but it should be understood that more than one connector can be used rather than a single connector. The connectors may also be located in different locations. For example, the connector 406 may be located at the back of the top of the module. As another example, the module may have two connectors, one located at the front of the top of the module (as shown) and one located at the back of the top or on the side of the top of the module. The modules may include a connector on either both the front and back side or both the left and right side. This may allow for the modules to be rotated by 180 degrees and will still communicate with the rest of the modular computing device.

The connector 406 may include a protrusion from the top side of the module. Depending on the type of connector, the protrusion may protect or include pins, sockets, blades, jacks, plugs, and the like, of the connector. As an alternative, the connector 406 may include a recess, including the appropriate pins, sockets, blades, jacks, plugs, and the like. The cap module 402 may not include a connector 406 on the top side of the module because the cap module 402 is intended to be the top of the vertical stack and no other modules will be connected to the top of the cap module 402.

The modules may also include a connector on the bottom side of the module, which may be the corresponding connector mate for the connector 406 located on the top side of the module. This connector may be in a corresponding location on the bottom side of the module to mate to the connector 406 located on the top side of a module. For example, the cap module 402, may include a connector on the bottom side for mating to the connector 406 on the base module 401 or another module below it. Alternatively, the cap module 402 may only have a recess for accepting the connector 406 of the module below it. For example, the cap module may not need any electrical connections and may therefore not include a mating connector, but may rather include a recess for accepting the connector located on the module below the cap module within the stack. In the case of more than one connector 406 on the top side of the module, more than one connector or recess may be included on the bottom side of the module.

The base module 401 may not include a connector 406 on the bottom of the module, because the base module 401 is intended to be the bottom of the vertical stack and no other modules will be connected to the bottom of the base module 401. However, additional modules (e.g., 403, 404, and 405), which may be included in the module computing device stack, may include a connector 406 on both the top side of the module and a recess or connector on the bottom side of the module. Thus, when the modules are connected together the connector 406 will create a contact and facilitate electrical connections (e.g., power transfer, data transfer, etc.) between or through the modules.

While each module may include the same connections for transferring data and/or power between modules, each module may not use every connection. In other words, each module may have the same connector and mate to ensure that the modules can be stacked in multiple configurations, but each module may not need or use every connection. As an example, the connector may include a connection for video data. This video data connection may be included in the connector from the base module through the graphics module, through the storage module, through the peripheral device module, and so on. However, the storage module may not use the data included in the video data connection. In other words, some connections included in the connector for the module may act as a pass-through to another module and may not be accessed or used by every module.

In one embodiment, the modules may include protrusions 409 on the bottom of the module and recesses 410 at the top of the modules. These protrusions and recesses may assist in aligning the modules and ensuring that connectors are aligned between the modules. The protrusions on the bottom of the module may act as feet for the module. For example, when the module is removed and placed on another surface the protrusions may be the only part of the module that touches the other surface. This may help in protecting the bottom of the module from becoming scratched, dirty, parts from being damaged, and the like. The length of the protrusions may be dependent on the connector size. For example, if the protruding part of the connector is on the bottom of the module, the feet protrusions may be longer than the connector protrusion to ensure that the connector does not touch another surface. The protrusions and recesses may also be reversed. In other words, the bottom of the module may include the recesses and the top of the module may include the protrusions. The number and location of the protrusions and recesses may vary.

Once the modules are aligned and the connectors are connected, the modules may be coupled together using a latch mechanism. At least a portion of the latch mechanism may be on the top side of a module. Additionally, at least a portion of the latch mechanism may be on the bottom side of a module. In other words, the mating parts of the latch mechanism may be included on different modules in order to connect the two modules. The latch mechanism may be of different types and configurations. However, the latch mechanism should be of a type that latches or locks all the modules together when engaged. For example, when the modules are coupled, the user can pick up the modular computing device by a single module, for example, by the carrying handles included in the cap module, and the entire system will remain intact.

In one embodiment, the latch mechanism may include a receiver and an attachment element. This type of latch mechanism is shown in FIG. 4. The receiver 411 is located at the top of a module. The attachment mechanism 412 is located at the bottom side of the module. As shown in FIG. 4, the attachment mechanism is not necessarily located on the bottom side of the module, but rather at or towards the bottom side of the module. The receiver 411 may include a tab. The receiver 411 may also be shaped to catch the attachment mechanism 412. For example, the receiver 411 may be shaped like an upside-down L. Other shapes are possible and contemplated.

The attachment mechanism 412 may be attached to the module in a way that allows the attachment mechanism 412 to rotate away from the module. For example, the attachment mechanism may include a sleeve that is attached to a pin of the module. The sleeve can then rotate about the pin. In other words, the attachment mechanism 412 may rotate about an axis of rotation. When operated the attachment mechanism 412 may move perpendicularly to one of the lateral edges of the module housing. When the latch mechanism (e.g., 411 and 412) is engaged, the attachment mechanism 412 may catch the receiver 411. For example, the attachment mechanism 412 may include a lip that catches under the receiver 411. Thus, when the attachment mechanism 412 is engaged with the receiver 411, the modules are coupled together in such a way that prevents the modules from coming apart when they are lifted.

In the example of FIG. 4, the module may also include a recess for the attachment mechanism 412. Thus, when the attachment mechanism 412 is "closed" or engaged, the attachment mechanism sits flush with the module. To release the attachment mechanism 412, the recess for the attachment mechanism has an empty portion (not filled by the attachment mechanism 412) for the user to pull the attachment mechanism 412 out. As shown in FIG. 4, the recesses and protrusions, as discussed above, may be incorporated into the latch mechanism.

In one embodiment, the latch mechanism may include a tab portion and receiving portion for the tab portion. For example, the bottom side of a module may include a tab portion and the top side of a module may include a receiving portion for the tab portion. The tab module may be inserted or slid into the receiving portion. A portion of the tab may then set into the receiving portion to become slidably engaged with the receiving portion. As an example, this type of latch mechanism may be similar to a side-release or front-release buckle.

The modules may include a removable cover 413 which allows access to the inside of the module. The removable cover 413 may allow a user to replace components within the module, perform maintenance, or otherwise access the interior of the module. In addition to the base module 401 and the cap module 402, the modular computing device may include additional modules (e.g., 403, 404, and 405). The additional modules may be used to change the configuration of the modular computing device. In other words, the additional modules may be used by a user in place of upgrading components within a workstation as would conventionally be done. Each module may also include fans for air circulation and cooling. Alternatively, the base module 401 may include a fan for air circulation and cooling which may be circulated through all of the attached modules. For example, the modules may include vents on the top side and the bottom side which allow for air circulation and cooling throughout the entire modular computing device.

The additional modules (e.g., 403, 404, and 405) may include components that allow for upgrading or reconfiguring the modular workstation. For example, some modules may include additional hard drive space, removable media components, a replacement graphics card, and the like. The modules may also include components which are required for operating the desired module. For example, a battery backup module may include circuitry for initiating the battery backup. While a module may be preconfigured with the desired components, a module may also be configurable by the user. For example, the graphics module may include connection ports for graphics cards, rather than also including the graphics card. This allows the user to buy any graphics card and use it with the system. The modular computing device allows a user to add additional modules for configuring the modular device. Example types of additional modules include a battery backup module 404, a storage module 405, a graphics module 403, a peripheral device module, a display device module, a removable media drive module, and the like. These additional modules provide the user with additional components that a user may need. For example, the storage module may include more than one hard disc drive that increases the amount of storage space the base module provides.

The additional modules may be included in the modular computing device in any order. In other words, the modules do not need to be included in a particular order. For example, the storage module 405 may be included on top of the base module 401, rather than on top of the battery backup module 404. Some modules may perform more optimally in different positions. For example, the graphics module 403 may perform better when coupled as close to the base module 401 as possible. However, such ordering is not a requirement. Thus, the user can configure the modular computing device in such a way that is convenient to the user.

The various embodiments described herein thus represent a technical improvement to current computing systems. Using the techniques described herein, a user can purchase a base module and add additional modules to configure the computing device in a way that is most useful for the user. Additionally, even when adding the modules, the modular computing device footprint remains the same and requires no additional footprint space from the user. The configurability of the modular computing device also allows a user to configure the device based upon needs. For example, if a user needs one configuration one day and a different one the next day, the modular computing device can easily be changed and configured with little effort from the user. Thus, using the systems and devices described herein, the user can be assured of a configurable computing device that can be configured for any need the user may have while maintaining a small footprint.

As used herein, the singular "a" and "an" may be construed as including the plural "one or more" unless clearly indicated otherwise. Moreover, the connectors described herein may be any type. It is specifically noted that the use of "male" or "female" connector in the description and claims is to be interpreted broadly, i.e., a "male" connector may be replaced by a "female" connector, and vice versa, so long as an operative, physical connection is achieved.

This disclosure has been presented for purposes of illustration and description but is not intended to be exhaustive or limiting. Many modifications and variations will be apparent to those of ordinary skill in the art. The example embodiments were chosen and described in order to explain principles and practical application, and to enable others of ordinary skill in the art to understand the disclosure for various embodiments with various modifications as are suited to the particular use contemplated.

Thus, although illustrative example embodiments have been described herein with reference to the accompanying figures, it is to be understood that this description is not limiting and that various other changes and modifications may be affected therein by one skilled in the art without departing from the scope or spirit of the disclosure.

What is claimed is:

1. A system, comprising:
a base module housing comprising a top side, a bottom side, and at least one lateral edge comprising a top portion and a bottom portion, the base module housing comprising:
a processor;
a memory device operatively coupled to the processor; and
at least one connector, integral to and disposed at the top side of the base module housing, for facilitating electrical connections; and
a cap module housing comprising a top side, a bottom side, at least one lateral edge comprising a top portion and a bottom portion, the cap module housing comprising:
at least one receiver, integral to and disposed at the bottom side of the cap module housing, for receiving the at least one connector;
wherein the base module housing and cap module housing are vertically connectable using at least one latch mechanism;
wherein at least a portion of the at least one latch mechanism is disposed at the top side of the base module housing;
wherein at least a portion of the at least one latch mechanism is disposed at the bottom portion of at least one lateral edge of the cap module housing and comprises an attachment element and wherein the attachment element rotates about an axis of rotation and when operated moves perpendicularly to at least one lateral edge of the module housing.

2. The system of claim 1, wherein the at least one receiver comprises at least one electrical connection.

3. The system of claim 1, wherein the cap module housing comprises at least one indentation for carrying.

4. The system of claim 1, wherein the cap module housing comprises an energy transfer device disposed on the top side of the cap module housing.

5. The system of claim 1, wherein the base module housing further comprises at least one recess for receiving feet protrusions of a second module and wherein the at least one recess is disposed on the top side of the module housing.

6. The system of claim 1, wherein the cap module housing further comprises at least one foot protrusion disposed on the bottom side of the cap module housing.

7. The system of claim 1, further comprising at least one additional module housing comprising a top side, a bottom side, at least one lateral edge comprising a top portion and a bottom portion;
wherein the at least one additional module housing comprises at least one latch mechanism; and
wherein at least a portion of the at least one latch mechanism is disposed at the top side of the additional module housing and wherein at least another portion of the at least one latch mechanism is disposed at the bottom portion of at least one lateral edge of the additional module housing.

8. The system of claim 7, wherein the at least one additional module housing comprises at least one connector for facilitating electrical connections, wherein the at least one connector is disposed at the top side of the additional module housing; and
at least one receiver, disposed at the bottom side of the additional module housing, for receiving at least one electrical connection.

9. The system of claim 7, wherein the at least one additional module housing comprises at least one recess, disposed on the top side of the additional module housing, for receiving a foot protrusion of another module and further comprises at least one foot protrusion disposed on the bottom side of the at least one additional module housing.

10. The system of claim 7, wherein the at least one additional module housing is selected from the group consisting of: a graphics module housing, a battery module housing, a display device module housing, a peripheral device module, and a storage module housing.

11. The system of claim 1,
wherein the at least a portion of the at least one latch mechanism disposed at the top side of the base module housing comprises a latch mechanism receiver for coupling to the attachment element when the latch mechanism is engaged.

12. The system of claim 1, wherein the attachment mechanism comprises a receiving portion; and
wherein the at least a portion of the at least one latch mechanism disposed at the top side of the base module housing comprises a tab element that when operated is slidably engaged with the receiving portion.

13. A device, comprising:
a module housing comprising a top side, a bottom side, and at least one lateral edge comprising a top portion and a bottom portion;
at least one connector, integral to and disposed at the top side the module housing, for facilitating electrical connections; and
at least another connector, integral to and disposed at the bottom side of the module housing, for facilitating electrical connections;
wherein the module housing is connectable to another module housing using at least one latch mechanism;
wherein at least a portion of the latch mechanism is disposed at the bottom portion of at least one lateral edge of the module housing and comprises an attachment element that rotates about an axis of rotation and when operated moves perpendicularly to at least one lateral edge of the module housing; and
wherein at least another portion of the latch mechanism is disposed at the top side of the module housing.

14. The device of claim 13, wherein the module housing further comprises at least one recess for receiving a foot protrusion of a second module, wherein the at least one recess is disposed on the top side of the module housing.

15. The device of claim 13, wherein the module housing further comprises at least one foot protrusion disposed on the bottom side of the module housing.

16. The device of claim 15, wherein the at least latch mechanism comprises the at least one foot protrusion.

17. The device of claim 13, wherein the at least one connector comprises a protrusion comprising pins for receiving a connector comprising sockets of a second module, wherein the protrusion is disposed on the top side of the module housing.

18. The device of claim 17, further comprising a recess, disposed on the bottom side of the module housing, comprising sockets for receiving a connector comprising pins of a second module.

19. The device of claim 13, wherein the at least another portion of the latch mechanism comprises a receiver for coupling to the attachment element when the latch mechanism is engaged.

20. A device, comprising:
a module housing comprising a top side, a bottom side, and at least one lateral edge comprising a top portion and a bottom portion; and
at least one connector, integral to and disposed at the top side of the module housing, for facilitating electrical connections;
wherein the module housing is connectable to another module housing using at least one latch mechanism;
wherein at least a portion of the latch mechanism is disposed at the top side of the module housing; and
wherein at least another portion of the latch mechanism is disposed at the bottom portion of at least one lateral edge of the module housing and comprises an attachment element that rotates about an axis of rotation and when operated moves perpendicularly to at least one lateral edge of the module housing.

21. The device of claim 20, wherein the module housing further comprises at least one recess for receiving feet protrusions of a second module, wherein the at least one recess is disposed on the top side of the module housing.

* * * * *